United States Patent
Koo

(10) Patent No.: US 7,251,805 B2
(45) Date of Patent: Jul. 31, 2007

(54) ASICS HAVING MORE FEATURES THAN GENERALLY USABLE AT ONE TIME AND METHODS OF USE

(75) Inventor: James T. Koo, Kowloon (HK)

(73) Assignee: Nanotech Corporation, Hong Kong (HK)

(*) Notice: Subject to any disclaimer, the term of this patent is extended or adjusted under 35 U.S.C. 154(b) by 253 days.

(21) Appl. No.: 10/964,456

(22) Filed: Oct. 12, 2004

(65) Prior Publication Data
US 2006/0080631 A1    Apr. 13, 2006

(51) Int. Cl.
  *G06F 17/50*    (2006.01)
(52) U.S. Cl. .................. 716/16; 716/1; 716/17
(58) Field of Classification Search .............. 716/1, 716/16, 17; 713/171, 322, 324; 326/37–39, 326/41, 47; 370/363
See application file for complete search history.

(56) References Cited

U.S. PATENT DOCUMENTS

| | | | |
|---|---|---|---|
| 5,852,561 A * | 12/1998 | Chan et al. | 716/17 |
| 6,766,406 B1 * | 7/2004 | Gasperini et al. | 710/315 |
| 6,937,493 B2 * | 8/2005 | Krause et al. | 365/63 |
| 7,042,899 B1 * | 5/2006 | Vaida et al. | 370/463 |
| 2006/0101288 A1 * | 5/2006 | Smeets et al. | 713/194 |

* cited by examiner

*Primary Examiner*—Vuthe Siek
(74) *Attorney, Agent, or Firm*—MacPherson Kwok Chen & Heid LLP; Gideon Gimian

(57) ABSTRACT

More ASIC functionality is crammed into a chip (or chip set) than can probably or definitely be operative at one time when the chip is packaged and inserted into a broader circuit. The excessive ASIC functionality is chosen to cope with different market development probabilities in a host of different market spaces and a subset of the excessive ASIC functionality is programmably activated in each market space after manufacture. In one embodiment, a mega-ASIC with excessive ASIC functionality crammed into it, has a universal core as well as plurality of programmably selectable ASIC function blocks. The ASIC function blocks are programmably activatable and de-activatable so that a mass produced can quickly respond to shifting market demands.

3 Claims, 4 Drawing Sheets

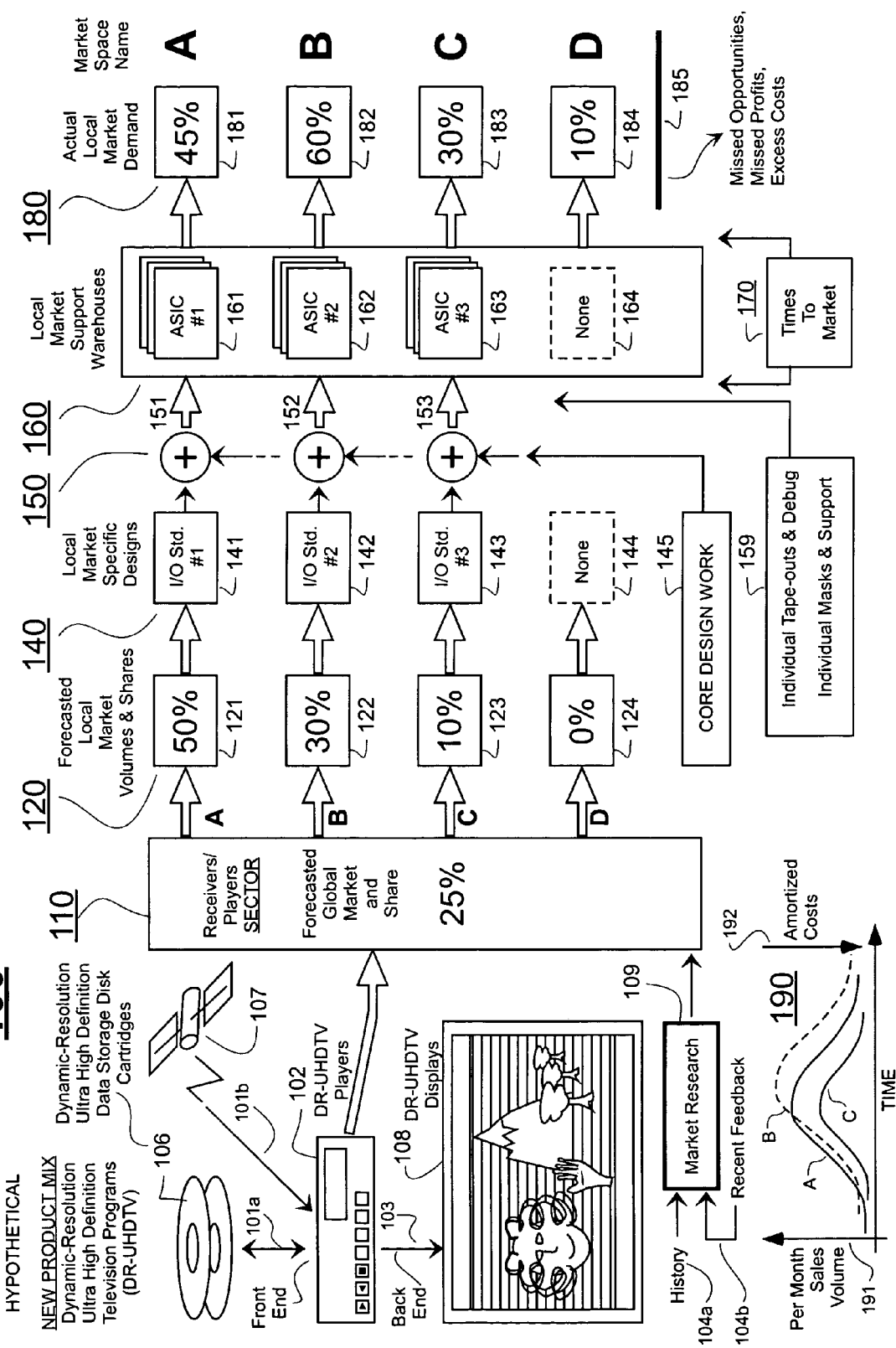

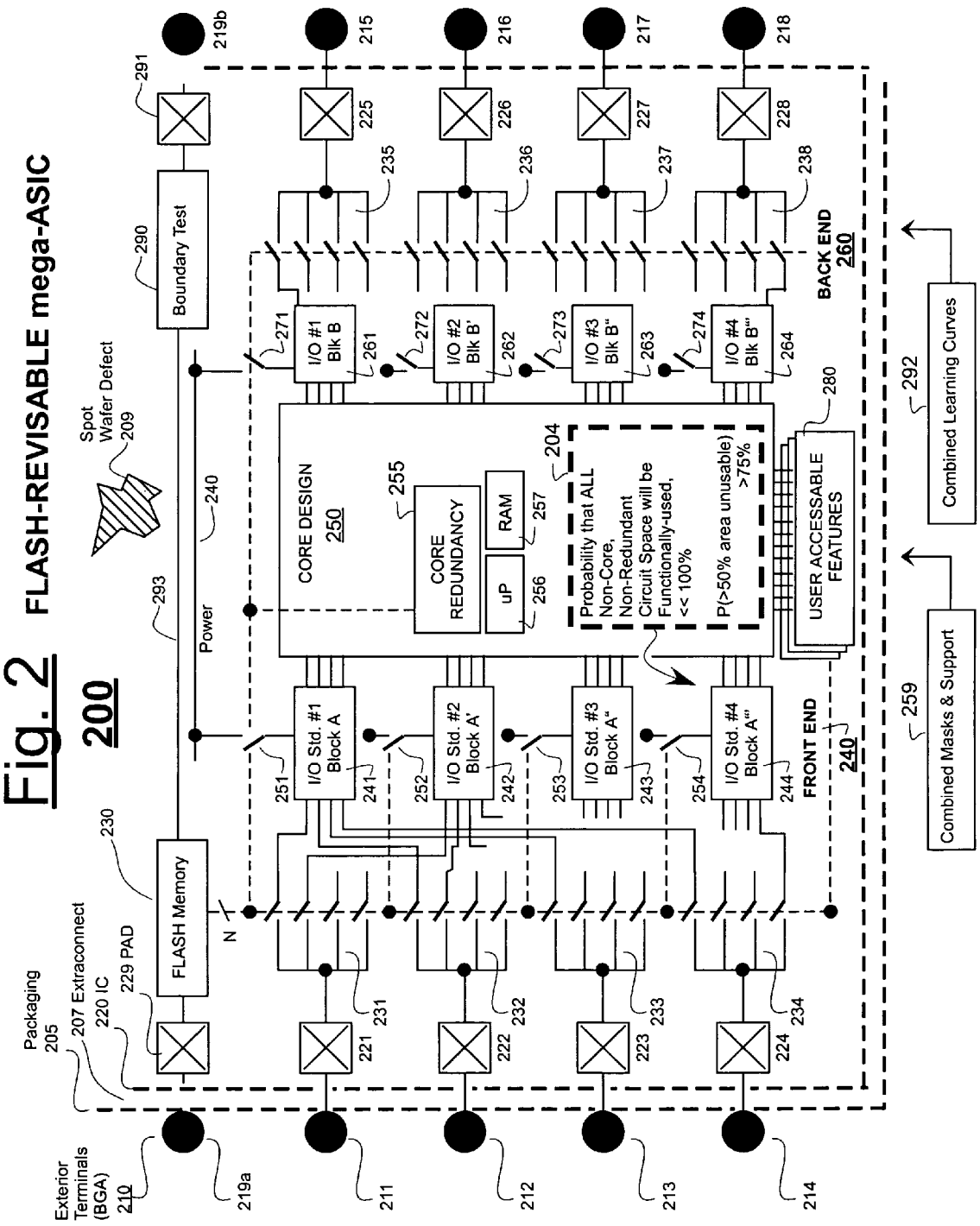

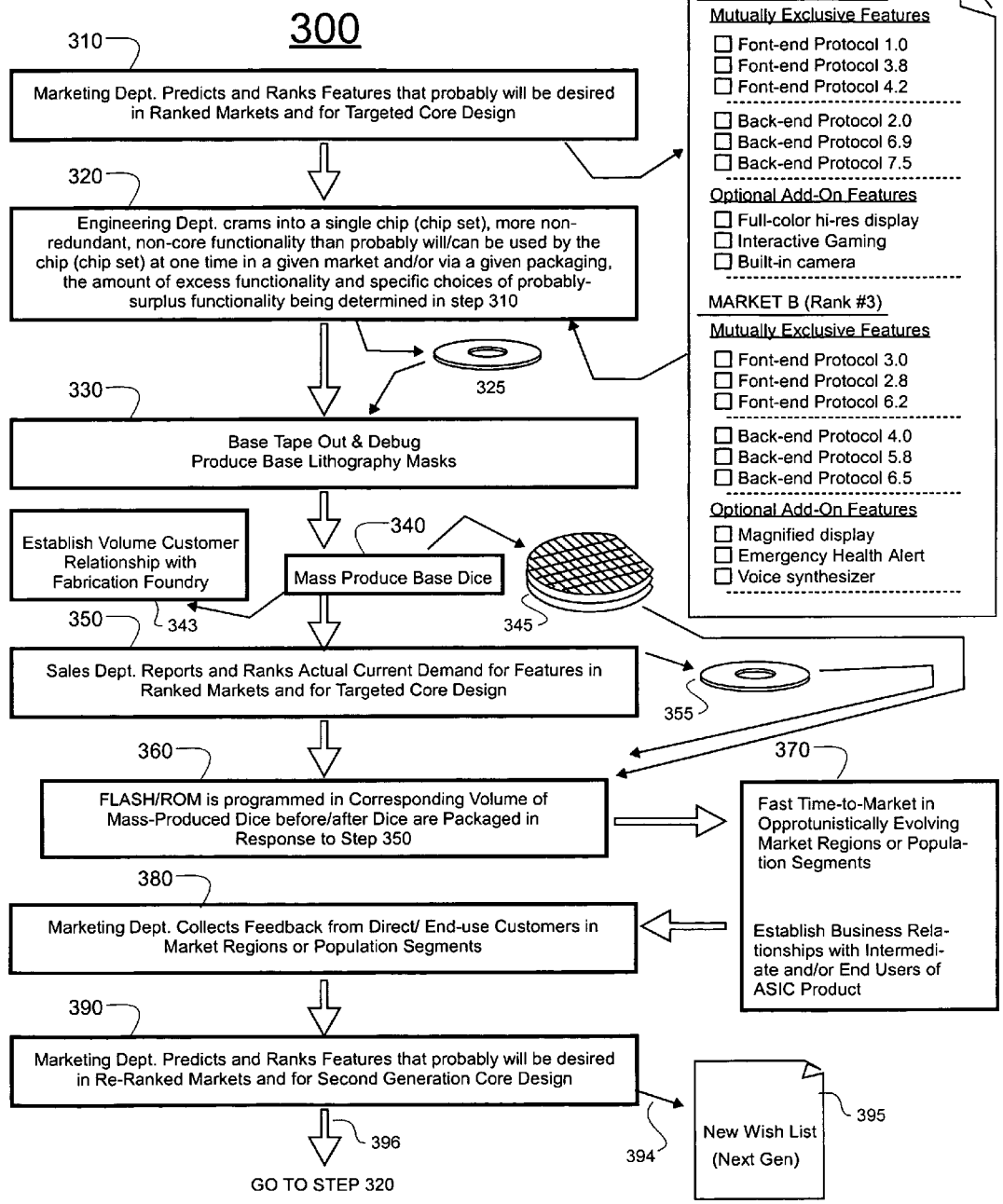

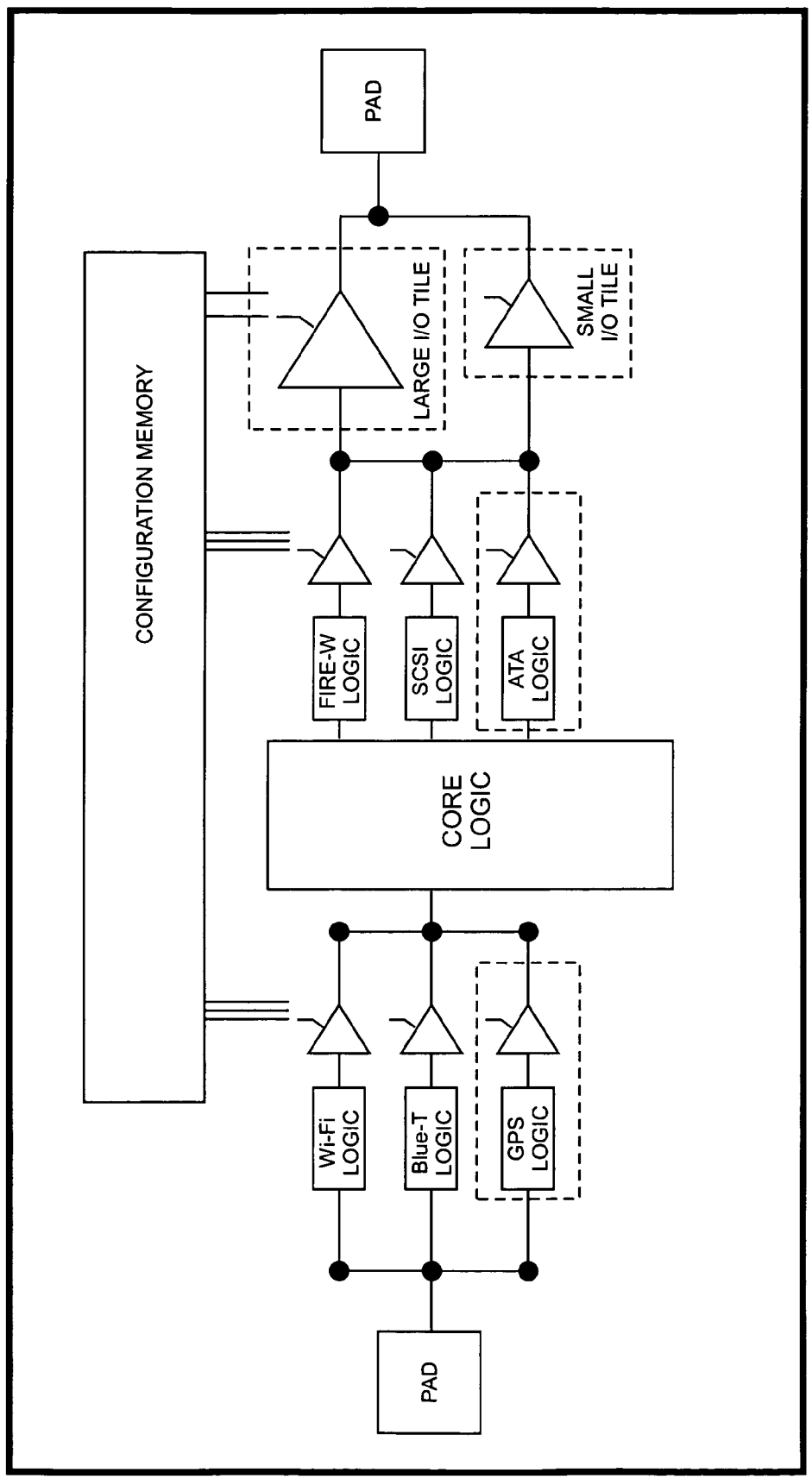

ASICS HAVING MORE FEATURES THAN GENERALLY USABLE AT ONE TIME AND METHODS OF USE

FIELD OF DISCLOSURE

The present invention relates generally to Application Specific Integrated Circuits (ASIC's) and more specifically to the marketing of, design of, manufacture of and distribution of ASIC's for use in different consumer markets.

DESCRIPTION OF RELATED ART

Low cost electronic products that are sold to mass consumer markets often include ASIC's (Application Specific Integrated Circuits). Conventional ASIC methodology relies on libraries of so-called, "standard cells". These libraries contain large numbers of pre-designed circuits (basic building blocks). When a new consumer product is designed to include one or more ASIC's, a subset of the pre-designed cells are typically chosen from available libraries for inclusion in the operative circuit space of the to-be-manufactured, monolithic integrated circuit (IC) and for use in a predefined consumer application (e.g., cell phone, PDA, video/music recorder/player, etc.). After the subset of cells are selected, one or more copies of those chosen building blocks are frugally laid-out in the IC circuit space, adjacent to appropriate other blocks and they are stitched together with interconnect to thereby construct more complex circuits within the IC. It is desirable to use a relatively minimal number of building blocks because IC circuit space is considered expensive. Examples of digital ASIC standard cells include multi-bit adders, multipliers, multiplexers, decoders, and memory blocks (look-up tables). Examples of analog ASIC standard cells include amplifiers, comparators, analog-to-digital and digital-to-analog converters. ASIC's may include mixed signal designs (IC's having both analog and digital circuitry on the same substrate).

Standard cells are generally hardwired, pre-tested and pre-designed for maximum compactness relative to the general purpose applications in which they are expected to be used. This form of optimization is not perfect though because specific ones of the general purpose applications may nonetheless call for different switching speeds, frequency ranges, voltages, currents and fabrication technologies. So a standard cell is rarely the most optimally compact and efficient design for a specific application. However, it is generally adequate given the diminishing returns tradeoff for redesign and optimizing efforts. One advantage of using standard cell libraries is that there is little guess work or surprise in determining whether each standard cell will work for its intended purpose or whether it will use up far more circuit space than may generally be necessary for realizing a desired function. The cells have been pre-tested and tweaked for meeting that goal in the general sense.

When compared with alternative approaches such as using an FPGA or a PLD, one outstanding advantage of using standard cells is that they tend to have much shorter signal propagating times for similar dimensions (e.g. transistor channel lengths) in fabrication technology. One outstanding disadvantage of using standard cells is that there is little room for flexibility and design change after specific ones of the hardwired cells have been chosen, judiciously inserted into the ASIC design and stitched together. This is so because standard cells are hardwired in nature. By contrast, consumer markets tend to be very fluid and fickle. One day, the consuming masses want one kind of function in their favorite consumer product (be it a new cell phone or a new PDA, for example) and the next day, perhaps simply due to whim, they change their minds and demand a very different kind of function. This is a very dangerous situation for ASIC manufacturers and marketing managers. A warehouse full of what, on one day is highly-demanded product, can become worthless overnight as the winds of consumer demand shift directions.

By way of a more specific, but hypothetical example, consider a case where a circuit designer has elected to use a first kind of data-inputting standard cell in his ASIC for processing input data streams (say RF wireless transmissions) according to a corresponding, first industry standard protocol, call it, decompression algorithm A. Industry experts have voted this algorithm A as being best. However, after the ASIC is put into mass production, market forces are such that the majority of customers change their minds and decide they want product that instead uses a different and incompatible, input processing protocol say, decompression algorithm B. A popular journalist may have indicated he likes B better and suddenly consumers are demanding products that use decompression algorithm B. In such a case, the mass-produced ASIC's which the designer has in his warehouses become essentially un-saleable. They work, but hardly anyone wants to buy them. The marketing manager should have had the foresight to ask the circuit designer to use a second data-inputting standard cell that processes input data streams according to the competing, decompression algorithm B in his ASIC design instead of using, the algorithm A block. The marketing manager failed to accurately predict the hard-to-predict changes in future market trends, where the future is one or two years ahead of time, the time required to design and mass produce an IC chip under current technology constraints. As a result, his company is not able to sell more than a few of the algorithm A chips to what few customers are using algorithm A. Often, so-called network effects for interoperable devices are at work. Although algorithm A is a reasonable and perhaps better choice, unpredictable market forces often come into play and allow an incompatible and alternate standard (algorithm B) to take an initial and commanding lead. This initial lead eventually translates into algorithm B becoming the dominant one in the given market space. The classic example is the BetaMax™ versus VHS™ format battle that played out in the video-cassette recorders markets (VCR markets).

In order to deal with the unpredictable shifts in consumer demand, some designers have suggested shifting to the use of in-field fully-programmable logic or analog devices. Field programmable devices (FPLD's, FPGA's, CPLD's, etc. in the digital world) are the complete antithesis of the full-ASIC approach. Essentially all of the circuitry in an FPLD is reprogrammable such that it can implement alternative functions. Thus the classic BetaMax™ versus VHS™ problem can be obviated by allowing for programmable downloading of one or the other of the incompatible options. Manufacturers can theoretically load into their fully-programmable chips, whichever of the competing protocols wins in the marketplace. The problem with the field-programmable approach, however, is that the fully-programmable circuitry tends to be more expensive, larger in size, slower in response time and prone to various problems which ASIC circuitry does not generally suffer from. One sample problem is that of having flawed software loaded into one or more of the many configuration memory cells (or fuses or anti-fuses) of a field-programmable device. Then the fully programmable device fails to work properly just because of the flaw. By contrast, because an ASIC standard cell is basically not programmable (not programmable to the same generic extent as are the counterpart, fully-programmable gate arrays), it is not prone to the wrongful configuration problem. Also, the ASIC design does not need to consume as much circuit space, electrical power and/or signal routing resources as does a fully-programmable (or fully re-programmable) field device for supporting configuration memory and its programmability or re-programmability. Thus the ASIC solution tends to be more reliable, more compact and more energy efficient.

Recently, a movement has begun towards a mixed genre referred to as "hybrid" ASIC-FPGA. The idea is to have some circuitry implemented as ASIC standard cells and other operative circuitry implemented as fully-field-programmable gate arrays. The specific mix and nature of such hybrid approaches is not well defined.

A theme that was common, heretofore, under the ASIC approach, under the FPLD approach, and even under the hybrid ASIC-FPGA approach was that of the sacredness of semiconductor circuit space. All the approaches sought to maximize the packing density of useful circuitry under the belief that semiconductor real estate (i.e. silicon area) was the most expensive aspect of selling an IC and that the packing density of useful functionality should be optimized without considering other costs. This disclosure challenges that fundamental belief.

SUMMARY

In accordance with one aspect of the present invention, the costs associated with mass producing a mostly-ASIC device are analyzed while also considering the probabilities that various functionalities will be saleable in the future. Based on such analysis, an overabundant plurality of selectably chooseable ASIC functionalities is crammed into the mostly-ASIC device for selectively servicing different combinations of possible market demands in the future. For example, if there is a 50% chance that consumers will next want the new WiFi-Y (a hypothetical name) capability in their laptops one year from now and a 45% chance that they will instead want BlueTooth-Z (another hypothetical name) for managing their laptop wireless communications, ASIC circuitry will be inserted into a corresponding mega-ASIC (an overly-stuffed ASIC) for both options with a programmable selection means for later choosing one of them. Such a mega-ASIC will cost more to mass produce than a competing ASIC having just WiFi-Y circuitry or just BlueTooth-Z circuitry, but then again, the more costly mega-ASIC will be programmable so as to be capable of immediately servicing the emerging market or markets no matter which direction the fickle public (or market in general) chooses and in what volume(s) it demands product of that type. Stated more generally, in accordance with the invention, one ASIC is mass-produced to simultaneously service a plurality of possible market direction choices even though all of the circuit space in the one ASIC will probably never be used in any one market space. Even though all of it will probably not be used in any one market space the chances are good that most of it will be used when viewed overlappingly across a panorama of different market spaces.

The situation is not as simple as merely picking WiFi-Y (hypothetical name) or BlueTooth-Z (another hypothetical name) because modern consumer products often provide a mix of interoperable capabilities and/or a mix of user-accessible features, where the latter features could be something like providing real-time on-line gaming capability or scientific calculator capability and so forth. Different geographic regions or demographic market spaces often develop differently. Thus, if there are three market spaces, A, B and C; where market A has a 75% probability of demanding feature-1 one year from now and a 10% probability of instead demanding a mutually-exclusive feature-2, and where market B has a 60% probability of demanding feature-2 in the future and a 30% probability of instead demanding a mutually-exclusive feature-3, and where market C has a 50% probability of demanding feature-2 in the future market window and a 50% probability of demanding a mutually-exclusive feature-3, then, in accordance with the invention, one ASIC should be mass-produced with all three, mutually-exclusive features (1, 2 and 3) on board and a programmable switching means is provided in such a mega-ASIC for use after mass production of the mega-ASIC. The programmable switching means is used after the mass production run to activate an appropriate one of the mutually-exclusive features (1, 2 and 3) as market demand is better ascertained over time in each of the plural markets (A, B and C). Although the ASIC producer will spend more to mass produce such an ASIC with selectable subsets (a so-called, mega-ASIC) for each of the plural markets (A, B and C) rather than having to choose one smaller ASIC design to service just one specific market, the mega-ASIC producer will have the advantage of gambling less on the possibility that the mass produced ASIC will be unsaleable in one or more of the target markets, and in gambling less on predicting what sales volumes will be realized in each of the diverse market spaces. There are further advantages to the mega-ASIC approach. These will be detailed below.

In accordance with the invention, as seen from one aspect, more hardwired and distinctive nonredundant functionalities (i.e. unique peripheral functionalities) are crammed into the finite circuit space of a monolithic integrated circuit (IC) than probably will ever be used simultaneously when the IC is made operative. In other words, a to-be-designated portion (identified for example, by future sales research results) of the finite circuit space of the IC is intentionally designed at the time the IC is mass fabricated, to probably remain unused after the IC is sold and installed in operative systems. The intentional inclusion of a probably-surplus (or definitely surplus) amount of hardwired functionality in the IC may come about due to the inclusion of two or more, hardwired, and possibly mutually exclusive, function blocks (e.g., features 1, 2 and 3 of the above example) and/or due to the inclusion of more hardwired function blocks than can probably be serviced by the finite number of extra-connect terminals (e.g., bonding pads) provided in the IC. The count of what constitutes intentionally excessive functionality (surplus hardwired functionality), as used here, does not include error-bypassing redundant circuitry (e.g., redundant memory cells) which are provided for replacing circuitry with the same functionality when the latter is rendered inoperative by spot defects. The concept is more easily explained by way of examples, as will be done below.

In accordance with a further aspect of the present invention, after mass-production, part of the surplus hardwired functionality in an ASIC is programmably activated and part is left deactivated. The decision regarding which part is to be activated and which is to be kept deactivated in each IC can be made in response to marketing or sales research results that are obtained after the IC has been mass produced and packaged. Selective activation and deactivation of the surplus ASIC circuitry may be made by way of selectively blowing fuses, selectively closing anti-fuses, ROM programming, EPROM, and/or EEPROM re-programming (e.g., FLASH programming). Other nonvolatile and/or volatile ways for implementing a configuration memory may be used, including use of MRAM technology (magnetic) and FRAM technology (ferroelectric). A large inventory of unprogrammed ASIC's may be maintained and an appropriate portion of that large inventory may be programmed for consumption as data about current market demand is collected and analyzed. When the winds of consumer (or other market) demand suddenly shift from one direction to another in a given market space, the unprogrammed and not yet consumed part of the mass produced inventory may be used for providing ASIC's with a different mix of operable features and/or for directing product volume towards market spaces in which the unprogrammed ASIC's in greater demand. Because a palette of selectable features is available in the unprogrammed mega-ASIC's, time to market can be significantly reduced once it is learned that consumers are demanding a new mix of features. Once again, the concept is more easily explained by way of examples, as will be done below.

One clear disadvantage of mass producing such a mega-ASIC, in other words, an IC that is excessively crammed with hardwired functionality where a non-negligible portion of the IC's precious circuit space will definitely (or with high probability) be wasted in a given market space, is that this increases the cost of providing the useable functionality in the remaining parts of the IC. Another disadvantage is that fewer dice will be produced from each mass produced wafer that contains such surplus-containing IC dice. Yet another disadvantage which appears to flow from such mass production of such overly-large dice is the reduction of yield since it is conventionally accepted that yield decreases with increase in die size.

Despite these apparent or real drawbacks, there are advantages which can more than offset the drawbacks. First, when consumer demand suddenly shifts toward demanding a new mix of features, time to market can be significantly reduced if some of the over-abundant but included functionalities of the already-mass-produced and on hand mega-ASIC's happen to meet the new and emerging market demands. The surplus functionality may be programmably activated to quickly meet the newly emerging market demands without having to wait for redesign, tape-out and special-run fabrications. Second, the per-die costs for supporting lithographic fabrication, design, and other design related costs of the IC can be reduced if a single set of photolithography masks (or other patterning means) and/or a single manufacturing plant (foundry) can be used to support different market spaces such as different regions around the world (e.g., Japan, Europe, USA, China—each of which regions often tends to have a unique mix of interoperability standards of its own). Gains from the manufacturing learning curve of one version of the common IC can apply to the manufacture of alternately activated versions of the same IC, where those alternately activated versions are to be used in different parts of the world or to service different market demographics (e.g., young students versus senior citizens).

Other aspects of the invention will become apparent from the below detailed description.

BRIEF DESCRIPTION OF THE DRAWINGS

The below detailed description section makes reference to the accompanying drawings, in which:

FIG. 1 is a block diagram of a hypothetical situation in which a new mix of products is to be launched around the world and different ASIC's are designed and produced (or not) to satisfy the unique needs of different regional markets (A, B, C, D);

FIG. 2 is a schematic diagram of a FLASH-revisable ASIC in accordance with the invention;

FIG. 3 is a flow chart illustrating how the use of a surplus-containing mega-ASIC can lead to rewards in future marketing and manufacturing activities; and FIG. 4 is a schematic diagram showing a tristate method for activating or deactivating various front or back end circuitry.

DETAILED DESCRIPTION

FIG. 1 is a block diagram illustrating a hypothetical situation 100 to which the here disclosed invention may be applied. It is assumed that industry standardizing committees have devised a roadmap for a new type and emerging of technology called Dynamic-Resolution Ultra-High Definition Television (DR-UHDTV). The specifics of what technologies might constitute DR-UHDTV is unimportant here. It is a hypothetical example. What is important here is that an intermediary product 102 will be developed that, among other things, will support interoperability with other DR-UHDTV-related devices (e.g., 106, 107, 108) according to locally adopted, interoperability standards. Assume for example that first signals 101a represent DR-UHDTV programming content that is to be stored in some form of data storage disk cartridge 106 in, for example, DVD or VCD or SVCD format depending on different regions of use and that second signals 101b represent DR-UHDTV programming content that is to be transmitted electromagnetically from satellite radio transmitters 107 and/or by way of fiber optic cables (not shown). Some sort of intermediary device, say a set top box 102, is to receive the storage cartridges 106 and/or the transmitted radio/optical signals 101b, process their output signals at a "front-end" portion of the intermediary device 102 and produce corresponding, back-end signals 103 for application to, for example, DR-UHDTV display units 108 (these could be high definition, color plasma displays, color liquid crystal displays or some other form of futuristic, image and sound projecting system). Once again, this hypothetical is merely for purposes of exposition. Other examples could have been used. For example, instead of being a settop box, the new, interoperative and intermediary device 102 could have been a personal digital assistant (PDA), a laptop computer, or a next-generation cell phone or some other convergent-technology device that interacts with standardized signaling protocols (101a, 101b, 103) associated with other interoperable devices (106, 107, 108) with different formats.

Because different regions of the world often use different languages, have different cultures, different histories and/or have developed different pre-existing, interoperability protocols or standards, it is often the case that standards-settings bodies (SSB's) in each of the different market regions (A, B, C, D) of our hypothetical 100 will establish different interoperability protocols for the new DR-UHDTV technology mix 105. The regionally-specific interoperability protocols may define how the DR-UHDTV signals are to be stored in storage units such as 106 and/or how such signals will be transmitted (10a, 101b) between different kinds of units and/or how display units (108) might process DR-UHDTV signals passed through the backends of intermediary processing units such as 102. By way of example, program viewers in Japan may expect to see high-definition imagery displayed according to a first set of aspect-ratios while content viewers in the United States may expect to see the displayed imagery according to a different set of aspect ratios, the reasons for the different preferences being cultural, historical, or economical. People in China may for example use VCD, SVCD, or EVD instead of the DVD format. Consumers in Asia may wish to have Karaoke function built into players or program materials whereas there may be little interest in Karaoke function in U.S. or European markets. On the other hand, multilingual capability may be deemed essential for Asian and European markets. Such end user expectations may influence how signals are formulated and processed all the way upstream, from the program production and distribution head-end, to the storage and transmission of individual program signals, and to the processing of signals at the intermediary processing units 102.

Suppose that a global manufacturing company plans to enter the intermediary processing unit market portion 102 (e.g., the set-top box market portion) of the newly emerging mix 105 of DR-UHDTV supporting technologies. Suppose that the market research department 109 of this global company forecasts that in a year or two from now (the time often required to design and manufacture the IC chip(s) and the system(s) employing these chips), the manufacturer will be able to capture approximately 25% of the global market (in forecast box 110) and that the market research department 109 also forecasts the magnitude of this global market share over a period of years (e.g., the next 5 years). Within the context of the forecasted global market 110 for the intermediary units 102, the marketing department 109 further predicts how much volume will be demanded in different market spaces such as A, B, C and D, and what shares of those markets the company can expect to capture. For example, the marketing department may determine that the company can capture about 50% of the Japanese market (market A) for such DR-UHDTV intermediary units 102 as is indicated in prediction block 121. At the same time, the marketing department 109 may predict that the same company will capture only 30% of the U.S. market (market-B) as is indicated in block 122. Moreover, the marketing department may forecast that the company will only capture 10% of the European market (market-C) as is indicated in block 123. For yet another regional market, designated as market-D (say China), the marketing department determines that the company will not be able to capture any appreciable amount of market share, as is indicated by the 0% in prediction block 124.

In a subsequent step 140, company executives decide to initiate design work for different ASIC's for the respective market regions 121, 122, and 123 where substantial sales are expected, as is indicated by regional-design work blocks 141, 142, and 143. No design work is initiated for regional market-D because the expected market share is roughly zero (schematic block 124). The lack of design work for market-D is indicated as "None" in corresponding block 144.

Suppose that a first input/output (I/O) signaling standard (I/O Std. #1) is selected for the front-end processing portions of the intermediary units 102 to be used in market-A (prediction 121) because of the peculiarities of preexisting standards in the Japanese marketplace. A different, second I/O standard (#2) is selected for the front-end portions of the intermediary units 102 of market-B (prediction 122) due to similar decision factors. Yet a different and third I/O standard (#3) is chosen for the design work 143 servicing the third regional market, market-C of prediction 123. The respective ASIC's that are to be produced for supporting the intermediary units 102 in the different regional markets (A, B, C) have a common core design 145 which is worked on in design-work block 145. (The core design work 145 may take place at company headquarters while the region-specific design works, 141-143, may take place at company locations distributed among the respective regional areas (A, B, and C)).

In a subsequent step 150, the core design work 145, is integrated with the regional I/O standard designs 141, 142, and 143 to produce respective, and substantially different, lithography mask sets for use in the mass production of the corresponding and different ASIC chips, 161, 162, and 163, perhaps at different fabrication foundries. (It will be understood by skilled artisans that the different fabrication foundries will typically have different fabrication technologies,—130 nm versus 90 nm transistor lengths for example—thus calling for significantly different mask sets and semiconductor fabrication recipes.) Once again, for market D (prediction 124) there will be no ASIC's produced and stored, as is indicated by block 164 (None). After design tape-out and testing of first silicon, and possible production of second silicon to overcome design faults found in the first silicon, separate mass productions (160) begin for the respective and different ASIC's 161, 162, and 163. The global manufacturer may have to establish separate relationships, as a small volume customer, with different semiconductor fabrication foundries for each of the different ASIC's 161, 162, and 163. This may put the manufacturer at a disadvantage relative to larger volume customers who typically receive more preferential treatment from the fabrication foundry workers. Large volume customers often receive lower cost quotes for the products, earlier time slots in the foundry for getting their productions finished. They often receive more help from the foundries in getting their processes tweaked for better yield and even lower final product cost. This makes sense from the foundry's viewpoint because the larger volume translates to higher operating efficiency and larger volume customers are more likely to come back with return business of larger size.

In addition to representing the manufacture of the different ASIC's, step 160 further represents the accumulation of the different, mass produced ASIC's 161, 162, and 163 in different local market warehouses that support the respective market regions A, B and C (corresponding to predictions 121, 122 and 123). The measure of time to market from the point of sales prediction 120 to the actual accumulation of product (160) in the warehouses (ready to ship) is represented by block 170. Times to market 170 may be different for each of the respective and different ASIC's 161, 162, and 163. This may be due to the peculiarities of managing the individual mask sets 159 and the individual foundry relationships (i.e., contracts) established for mass production of these different, individual designs (161, 162 and 163).

Step 180 represents a possible sales outcome that is different from the original predictions 120. Despite the original expectation of 50% market share in market A (prediction 121), the actual local market demand in market A turns out to be a smaller 45% as is shown in block 181 and volume is lower than projected. For regional market B, the actual demand provides a 60% share, and volumes are higher than projected, this being represented by the large number in block 182 relative to the 30% figure originally predicted in block 121. Because of the disparity between prediction and actual market demand, the ASIC supplies in warehouse 162 are too small. The company has been caught by surprise and is unable to quickly meet the unexpected, greater demand of region B. It takes time to fire up the foundry and make more chips from the individualized masks (159) created for design 162. Perhaps a more agile competitor is able to enter market B (situation 182) and take away from some of the sales potential missed by the first company.

In contrast to the warehouse shortages being experienced in market B (situation 182), the warehouse supplies 161 of region A constitute an excess of unsaleable inventory because of the disappointing demand 181 in region A. The company is therefore suffering from two opposing situations: an excess of inventory in one region (181) and a deficit of inventory in a second market space (182). In local region C, the demand for 183 for the company's product 163 is even more surprising than what was predicted in block 123. The local warehouse supply 163 is substantially below that needed for meeting local market demand. Yet more surprising, in local regional market D, the company receives unexpected requests for product as is indicated by block 184, even though no product has been made (see block 164) for this region and even though no design work (see block 144) has been carried out for supporting the unique signaling protocols of this regional area. An opportunity for entering market D is lost because of the faulty predictions 124 made by the market research group 109. To be fair, they cannot be blamed because prediction of sales, especially when made perhaps a year or two or longer ago, is far from being an accurate science. Quite often, even the most savvy of marketers makes wrong predictions when asked to do so that far ahead in time. The bottom line 185, that can be drawn from the above hypothetical (situations 110-180) is that the design and production of region-specific (or market-space specific) ASIC's 161-163 can lead to excessive inventories in some places (161), missed opportunities in others (184), missed profits and excess costs. The excess costs may include those which account for the individualized support 159 that must be given to different lithography mask sets and production lines for producing the different ASIC designs 161-163. Also losses may be attributed to missed opportunities in regions such as D where demand 184 unexpectedly developed for product but there was no product 164 or even a pre-existing design 144 to satisfy the unexpected demand 184. As a result, the company may lose a substantial amount of time in entering market D (situation 184) after it learns of demand for the product. Competing companies may enter market D faster and preempt the first company from reaping full rewards from the missed opportunities in that market D. Moreover, because the first company fails to enter market D early on, the company's market researching group 109 may miss out on feedback it would normally receive from actual sales in that regional market. The feedback may allow the company to formulate more competitive product for the next go around in that market D. Thus, failing to capture an early position in a given market space (e.g., market D, 184) often results in more loss than just the immediately lost sales for the current generation of product. It also retards advancement of position in the subsequent product generations.

There are various production learning curves (not shown), and market-entry and saturation curves (191) and cost amortization curves (192) to be associated with individualized productions of integrated circuits in different market spaces. It is understood in the industry that the larger mass production volume is in a given foundry, the faster the per chip costs will tend to go down over time because foundry operators learn more quickly how to optimize the fabrication process when they are provided with the experience of larger volumes. Therefore on the production side of the equation, an enigma exists. If the company produces too many chips, it may be caught with excess inventory as is the case in hypothetical situation 161/181. On the other hand, if it produces a smaller volume of chips, the company will not be able to benefit from large-volume learning curves. There are also problems with capital investment and quick return on investment. Initial sales volumes tend to be relatively low as market penetration begins in an early-adaptors market space (e.g., market A of prediction 121). The amortized cost per chip (192) therefore tends to remain very high until sales volumes pick up and help to cover the initial costs for design and production. Increased sales volume in one region (A) may not help to compensate for the capital expenses of a different region (C) if the ASIC's used for the two different market spaces have different designs (e.g. design 161 and design 163). Thus, in the plot 190 of FIG. 1, even though sales volume may have picked up in market A (situation 181) by the time design 163 is first introduced into market C (situation 183), that will not help alleviate the costs of design 163 because the two designs use separate designs, separate design centers, separate foundries and/or individualized mask sets 159. There is no cost sharing in those respects.

FIG. 2 shows an unorthodox approach 200 for dealing with these problems. In accordance with invention, a design 220 of a substantially-ASIC type (a mostly hardwired design) is formulated so as to use more circuit space than will probably be needed for implementing the functionality of a given product (e.g., 102) in any one of the regional markets (e.g., A, B, C and D of the hypothetical example of FIG. 1) or in any one of other types of market spaces (e.g., demographic spaces). By way of example, instead of including just enough front-end I/O circuitry 240 for handling the front-end I/O standards (e.g., I/O Std. #1 shown in block 241) that are predicted to be most probably required in a given, first market space (e.g., market A per prediction 121 of FIG. 1), the manufactured integrated circuit 220 further contains circuitry for implementing the very different front-end I/O protocol standards of two or more other market spaces (e.g., front-end I/O Std. #2, #3 and #4 of respective market spaces B, C and D). More specifically, assume further that prediction 121 was made with a 95% assurance that I/O Std. #1 will be used in market-A by front-end couplings 101a, 101b) rather than a 100% assurance. Assume that there is a predicted 4% chance that market-A will instead choose I/O Std. #4 for its front-end signals. Note that in the illustrated example of FIG. 2, the front-end processing portion 240 of the ASIC 220 has been provided with four different input/output processing blocks corresponding to first through fourth, mutually-exclusive I/O processing standards: #1A, #2A', #3A" and #4A'". Only one of these blocks, 241-244 can be used in a given application and the other three of the blocks will be useless in that same application environment because the front-end protocols are so different, their circuitry cannot overlap to any beneficial extent. For example, one may be a primarily analog signaling method (e.g., Ethernet) and the other may be a primarily digital, and parallel copper wire or serial optical fiber signaling method (optical fiber signaling methods often use different symbol encoding techniques than parallel copper connections). The front-end, I/O processing functions of blocks 241-244 are therefore mutually exclusive and each is fashioned as a separate ASIC block. Under conventional wisdom, this would not be done because it would be wasteful of IC circuit space. However, in accordance with the invention, it is done so as to obviate the problems discussed for FIG. 1.

Suppose for example, that although marketing department 109 had given a 95% assurance that front-end I/O Std. #1 would be used in market space A, the predicted 4% chance comes to pass that I/O Std. #4 is instead used in market space A. (Perhaps marketing also predicted a 0.5% outside chance that a newly-proposed I/O Std. #5 (not shown) would be used in market space A.) By having elected to provide support for both front-end I/O Std. #1 (block 241) and I/O Std. #4 (block 244) in the same integrated circuit, the company will have increased its probability of guessing correctly about the front-end signaling protocol from 95% to 99%. Of course, due to limited chip space and infinite number of possibilities, the manufacturing company would have to draw the line somewhere and not include support for every conceivable, front-end signaling approach, say the 0.5% chance for standard #5. Thus, in response to market rankings and probability rankings provided by the marketing department (see item 305 of FIG. 3), the manufacturing company may choose to leave out support for unlikely I/O Std. #5 (0.5% probability). The company hedges its bets between putting all its eggs in one basket (one I/O standard) and having backup eggs in additional baskets even though the cost of carrying of additional baskets on a same IC is greater.

The concept of including an excess or surplus amount of ASIC circuitry within a monolithic IC is not limited to blocks whose functionalities are different from and mutually-exclusive of one another. That was just a simple-to-understand, first example. Suppose that the pin-out of the packaging 205 used for this particular ASIC 220 is such that there are only enough exterior terminals 211-214 provided for carrying a predefined number of front-end I/O signals, be they bidirectional or unidirectional. Suppose that in one embodiment, only four exterior terminals 211-214 (e.g., Ball Grid Array bumps) are available for carrying a corresponding, no more than four signals associated with only a given one of the four front-end I/O blocks 241-244 provided in the chip. (The 4 four exterior terminals 211-214 might be designated as clock, data, command and interrupt for example.) If a given one of the front-end I/O blocks 241-244 is operatively coupled to the 4 I/O terminals, 211-214, then none of the other front-end I/O interface blocks can be simultaneously processing I/O signals coming in or leaving through those front-end I/O terminals 211-214. So even if the functionalities of blocks 241-244 were not mutually-exclusive, they might still block one another out due to bonding-pad and/or exterior terminal limitations. (There simply are not enough bonding-pads and/or exterior terminals available to simultaneously support the functionalities of all the excessive number of ASIC blocks, 241-244 and 261-264 that have been crammed into the operative circuit space of IC 220.)

In accordance with the invention, a set of programmable switches, 231-234 are provided for respective bonding pads such as 221-224 and/or for the corresponding, excessive set of front-end I/O processing blocks 241-244 so that only one of the excessive number of ASIC blocks can operatively couple to the external world via the limited number of exterior terminals 211-214. This is not the same as time-based multiplexed use of the exterior terminals 211-214. The programmable switches, 231-234 may be provided as one-time blowable fuses and/or one-time makeable antifuses. When a chosen one of blocks 241-244 is operatively coupled to the limited number and/or fixedly positioned, exterior terminals 211-214, that by design renders the other three of blocks 241-244 as unusable surplusage in a given application environment. The one of four choices is simply by way of example. In an alternate embodiment, it could be that any combination of 2 of the 4 blocks, 241-244 can be coupled simultaneously to the external world while the other two become reserve or excess baggage. The point is that more selectably-activatable ASIC functionality has been crammed into the operative circuit space of the IC chip 220 then can probably be used at one time and that a means has been provided for operatively activating a selectable subset of the excessive ASIC functionality and for rendering as non-operational, another portion of the excessive ASIC functionality.

The non-operational state of the excess ASIC functionality does not have to be a permanent one. In one embodiment, a FLASH memory unit 230, which can be a monolithically integrated part of the mega-ASIC or can be provided as a separate, in-package or external chip to simplify the process technologies used for the mega-ASIC and the FLASH memory unit 230, is provided for operating the bonding-pad coupling switches 231-234 such that each bonding pad in the I/O front-end section, 221-224 will correspondingly couple operatively to only one of the four possible front-end processing blocks 241-244. The other three front-end processing blocks will be operatively decoupled. In order to save on power consumption, additional power switches 251-254 may be provided for respective front-end I/O blocks 241-244 and these are made responsive to command signals from the FLASH memory unit 230, so that the unused three of the four front-end I/O processing blocks 241-244 will draw no power and only the one utilized front-end I/O processing block will be coupled to the power rail 240. The unused three front-end I/O processing blocks will therefore not generate heat when the ASIC 220 is in use. Because the FLASH memory unit 230 is re-programmable, one obtains a FLASH-revisable subset of operational, ASIC blocks, or more simply, a FLASH-revisable mega-ASIC. In one embodiment, unit 230 is instead a volatile memory such as SRAM and the configuration data is downloaded from a chip external source such as a pre or re-programmed non-volatile source (e.g., an external FLASH unit).

Programming of the FLASH memory unit 230 (or more broadly, the block actuating/de-actuating memory 230) does not have to be accessible by end users (of the DR-UHDTV Player, for example). It may be something that can be done only by the manufacturer, or vendor of the mega-ASIC at the factory or warehouse, prior to, or after packaging; or something that can only be done by those who posses an encrypted key that unlocks the programming function for the blocks-actuating/de-actuating memory 230. The FLASH and/or other configuration memory unit 230, whether as part of the mega-ASIC chip or provided as a separate in-package chip, may be made programmable through its own, dedicated bonding pad 229, where that bonding pad 229 is a "buried" one which is not coupled by way of bonding wires (extra-connect 207) to a chip or packaging exterior terminal such as 219*a*. Alternatively, the configuration memory unit 230 may be made programmable through its own wireless receiver (e.g., RF tuner plus antenna plus RF power capturing unit) so as to receive data sent by corresponding transmitter of the programming equipment. In this wireless embodiment, hundreds, thousands, or even tens of thousands of mega-ASIC can be blanket programmed (or re-programmed) simultaneously with one RF transmitter or groups of mega-ASICs may be selectively so (re-)programmed when addressed by group number portions of respective serial numbers encoded into the chips. As another alternative, a bonding wire (not shown) may be provided between exterior terminal 219*a* (e.g. a ball grid array node, BGA) and the corresponding bonding pad 229 so that end users may elect to re-program the FLASH memory unit 230 after it has been packaged in a corresponding packaging 205. In yet another embodiment, the FLASH memory unit 230 is programmed and verified by way of a serial boundary testing unit 290 which couples to a boundary-testing serial interconnect pad 291. Pad 291 may be a buried one or one that is coupled to exterior terminal mode 219b or even one that shares an existing exterior terminal 218 with other pads. An encrypted key may be required to unlock the boundary testing unit 290 and its ability to reprogram the blocks-actuating/de-actuating memory 230. In one embodiment, therefore, the serial testing circuit (290, or section 230 itself) includes decryption circuitry (not shown) for receiving an encrypted key signal. Proper decryption of the encrypted key signal is required to enable programming of the programmable, block activating/de-activating means (230) with new configuration data for setting configuration switches (fuses) such as 231-234, 251-254, 271-274 and 235-238.

It should be apparent from FIG. 2 that if ASIC block 241 is selected as the operational front-end I/O processing unit (utilizing signaling protocol #1A), then one switch in set 231 will be activated to couple pad 221 to a corresponding node of block 241 while further corresponding nodes of blocks 242-244 are operationally decoupled from pad 221. Similarly, a second switch in switches set 232 will be activated to couple pad 222 to a corresponding second node of block 241 while further corresponding; second nodes of blocks 242-244 are operationally decoupled from pad 222. The same will apply to switch sets 233 and 234 and their respective pads, 223 and 224. It is to be understood that the functionalities of the frontend switch sets 231-234 can be provided by a variety of different ways and that the frontend switch sets 231-234 are illustrated primarily for showing the underlying concept. The frontend I/O processing blocks of 241-244 may be selectively caused to be operatively coupled to the input terminals 211-214 simply by selectively powering up only the chosen one of blocks 241-244. Tristate switching of the output terminals of active and inactive blocks may be used.

It should be further apparent from FIG. 2 that the operationally activated one of the four front-end I/O processing blocks 241-244 couples to a core design section 250 within the IC circuit space 220. A similar structure for operationally activating some ASIC blocks and disabling others is shown for the back-end I/O processing blocks 261-264. Programmable switch sets 235-238 will be operated by appropriate programming of bits in the FLASH memory unit 230 so that only one of the back-end processing blocks 261-264 (I/O standards #1B through #4B''') is operatively coupled to bonding pads 225-228 and so that the selected one block of group 261-264 also receives power from power rail 240. The other three back-end I/O processing blocks will be rendered non operative, and will not consume power from power rail 240. Once again, it is to be understood that the functionalities of the backend switch sets 235-238 can be provided by a variety of different ways and that the backend switch sets 235-238 are illustrated primarily for showing the underlying concept. The backend I/O processing blocks of 261-264 may be selectively caused to be operatively coupled to the output terminals 215-218 simply by selectively powering up only the chosen one of blocks 261-264. Tristate switching of the output terminals of active and inactive blocks may be used.

The advantages of the above-described ASIC 220 should quickly become clear in view of the problems set forth above for FIG. 1. The separate warehouses 160 which used to stock individual and different ASIC's 161-163 for distribution into different market regions A-D will no longer need to stock different ASIC's. One central inventory may be maintained that contains a cumulative volume of not-yet-programmed, mega-ASIC's like 220. As customer demand develops in each specific market space, the appropriate number of mega-ASIC's will be then programmed to activate the appropriate front-end block (from group 241-244) and back-end I/O block (from group 261-264) for servicing the demand in that specific market space. If mistakes had been made by the market research department 109 in forecasting which particular I/O standard protocols will be used in each region and what the demand volume and market share will be in each region, that will not matter as much. For example, if at the last moment, government officials in region A decide to use front-end I/O standard #3A" (243) instead of the expected standard #1A (241), then the FLASH memory unit 230 of already mass-produced, mega-ASIC's like 200 may be quickly programmed to activate front-end processing block 243 instead of block 241. At the same time, the back-end I/O processing standard may continue to be the one implemented by block 261 rather than 262. The warehouses which stock the FLASH-revisable mega-ASIC 220 can therefore quickly react to changes in the respective regional market places A-D rather than waiting for new designs like 140 to be made and taped out (159) and delivered to the regional warehouses 161-164 after long delays. If sales volumes are higher than predicted in one region (e.g. 182) and lower in another region (e.g. 181), then the FLASH-revisable mega-ASIC chips 220 may be easily programmed from region to region to satisfy the spot demands of the more successful market areas. Sales may even be made to regions such as 184 where the marketing department 109 predicted that there would be substantially no market share (124) and where the facts turn out to be otherwise (184). Of course, this last scenario assumes that the designers of the FLASH-revisable mega-ASIC 220 were sufficiently farsighted to include the corresponding front-end I/O processing block 244 and back-end processing block 264 that is to be used in the unexpected market region, D. (Blocks 244 and 264 might have been inserted to serve market spaces other than market-D (situation 184) and it could be mere luck that they fit the needs of that surprise market-D.) A process for deciding which of the excessively numbered selectively-activateable ASIC blocks to include in the mega-ASIC 200 and which to not include, will be discussed in conjunction with FIG. 3.

Another advantage of the disclosed approach is that, should consumer tastes suddenly change, or should the community-accepted interoperability standards change, as can often be the case, the mega-ASIC may cope with the rapidly changed market situation(s) merely by programmably changing the selection of the input or output blocks, thus prolonging the sellable-product life of this mega-ASIC. Although the given examples assume mutually-exclusive alternatives for the front and backend blocks, the present disclosure contemplates situations where more than one of the input or output blocks is selectively activated for servicing an actual market space.

A somewhat awkward analogy can be made for enhancing the understanding of what has been described here. At the fast food establishments all condiments (e.g., catsup, mustard, salt, and pepper) are routinely prepackaged and served to 100% of the customers in a take-out packaging bag together with their core meal choice (e.g., hamburger and French fries) even though it is clear that most customers will not consume 100% of these condiments. Say only 50% will use the catsup, only 30% will use mustard and only 1% will use both catsup and mustard on their hamberger, and French fries. While it is possible, but not economical to make, inventory of and dispense 15 different possible combinations of hamburger with just these 4 condiments alone. The prepackaging, inventory stocking and dispensing of one packaging containing all possible condiments to everyone eliminates the time and effort that would be wasted in discovering exactly which each customer wants and custom-packaging each unique combination. Another example taken out of the non-analogous art of dispensing food relates to how passengers of airlines are served. Roll, salad, and desert are prepackaged for always being served with the entree instead of creating a possible 7 permutations just with these three items (of roll only, salad only, desert only, roll with salad, roll with desert, salad with desert, and roll with salad and desert). The possible number of permutations goes up quickly as the number of optional items increases. There are over 100 possible combinations for 7 optional items described above (catsup, mustard, salt, pepper, roll, salad and desert).

Design of ASIC chips is not the same as packaging fast food with condiments into a quick-takeout bag. However, the given examples bring us to some of the fundamental points of the present invention, as exemplified by embodiment 200 of FIG. 2. Although the structure is wasteful of circuit space (because there is a fair likelihood that the circuit space occupied by I/O blocks 244 and 264, for example, will never be all used), the structure 200 allows its mass producer to quickly deliver what each ASIC customer wants, without running out of any item on the menu of available features no matter how the demand fluctuates unpredictably from day to day. While it appears that the cost of the manufactured "mega"-ASIC 220 is unnecessarily increased due to the consistent inclusion of surplus selectable functionalities, and it appears that the size of the manufactured ASIC 220 is being unnecessarily increased, and that unnecessary design work such as 144 (assume block 144 is filled with the design of I/O standard #4 used in ASIC block 244) has been carried out, the financial accounting for such "surplus" steps may be such that it is worthwhile to gamble on the extra costs and on the waste in view of the fair likelihood that markets will fluctuate unpredictably and that the mass producer of mega-ASIC 220 will miss out on a valuable entree opportunity into a new market region such as market-D (prediction 124) if he does not have his mega-ASIC ready and prepared ahead of time to take advantage of unexpected shift in demand 184. When a market entry opportunity is missed, much more is lost than simply selling the current round of ASIC technology into new market space 184. Also lost is the value of customer relationship, getting customer feedback 104b from valuable customers in this new region 184 and establishing a better foothold in the new marketing region 184. When the next generation of IC's is next designed or produced, the manufacturing company which succeeded in getting an early and strong foothold will have an enhanced ability to predict what types of additional functional features customers in the new market region 184 desire and the company will already have established customers with goodwill in that marketing region, such that it is easier to sell future generation chips into that market region and to establish domination in that market region D. This will be better understood when FIG. 3 is discussed below.

Referring still to FIG. 2, the inclusion in the mega-ASIC 220 of the excess or surplus, noncore and selectable functionalities (which can be deemed as unique peripheral functionalities) 204 is to be distinguished from redundant, error-bypassing circuitry that might also be included in the IC to cope with the problem of spot manufacturing defects such as spot wafer defect 209. Those skilled in the art understand that sometimes a small defect in the silicon substrate or elsewhere during the manufacturing process can render a very small portion of a vital piece of circuitry inoperative. By providing a small amount of redundant, and programmably-activatable circuitry, the entirety of the chip 220 can be made operative even when the small spot defect 209 hits a vital organ of the chip such as the working memory (RAM 257) used in the core design 250 by another critical unit, such as microprocessor or controller 256. An extra row and or column of memory may be provided in RAM section 257 to take over in the case that one of the other columns or rows is hit by the spot defect 209. The defect-struck portion is deactivated. However, the non-core, surplus functionality 204 discussed here is not of that nature. Instead, the surplus circuitry 204 provides different selectable and perhaps optional functionalities rather than simply redundant same functionalities. Because there is an excess amount of such non-core, surplus selectable optional functionality 204, it is known at the time of manufacture of the bare die 220 to a fairly high degree of probability (say 90% or better, if not with full certainty) that at least some substantial portion of the nonredundant functionality 204 will be not used when the chip 220 is made operational. If the core design 250 is structured, for example, such that it can only use one front-end I/O processing block for receiving front-end signals from bonding pads 221-224, then when a specific I/O block (say 243) is later activated by making power connection (say 253) and appropriate other connections in switch sets 231-234, then at that time the other front-end I/O blocks will become unused space wasters. At that time it will generally be desired to open power switches 251, 252, and 254, and to further open the corresponding connecting switches in areas 231-234 so that each of unneeded blocks 241, 242, and 244 becomes inoperative. (Breaking open a power connection may not always be necessary.) Therefore, the bulk circuit space occupied by the unused blocks, 241, 242, and 244, becomes excess and unusable at the time of programming of the FLASH memory unit 230 or of another type of blocks-actuating/de actuating memory 230. The fact that such real estate wastage will most probably occur (in other words, that the circuit space of 241, 242, and 244, although not specifically those blocks, will probably be left fallow) was known at the time that the mega-ASIC die 220 was manufactured. It was known that there would probably be wasted semiconductor real estate and that the entirety of the non-redundant portion 204 of the semiconductor real estate would not be usefully employed; only a smaller fraction of that semiconductor real estate consumed for the selectable optional function blocks would be used. The specific parts that would be used, and those that would not, was not known with certainty though. Demand changes as market forces change.

In terms of a more concrete example, assume that at the time of manufacture, the predicted probability is 75% or more that at least about 50% of the non-core non-redundant real estate 204 will be rendered inoperative when sold because customers will not then want the functionalities of that, at least about 50% of the available, on-board functionalities (some of the latter, but not necessarily all, might be mutually-exclusive relative to the functionalities which are activated). The market predictors simply did not know exactly which subsets of the 100% of the distinct functionalities 204 will be later desired by customers and which will not. The illustrated mega-ASIC 220 allows the market predictors to increase their chance of success. More specifically, in the area of hard-disk controllers, a choice among four distinct types of host interfaces might be required for each disk size, say 100 GB-1000 GB hard disks: ATA, SCSI, Firewire, and USB. The die layout space for each of these types of host interface circuits may be relatively small when compared with that of the basic disk controller chip. Thus, in accordance with the invention, wastage of the circuit space consumed by three of the four types, and even by sub-types among these types, would not be as costly as might first appear. One could include ASIC circuitry for all four I/O host-interface standards in one design and then program that mega-ASIC chip to operate as an ATA, SCSI, Firewire or USB controller chip as dictated by current market demand. Today the customers may want ATA interface, but maybe 6 months later, the customers will want a disk extension bus that operates according to the FireWire protocol, or maybe according to the USB protocol. No one knows for sure. By providing the likely types for all four on a single chip 220, even though it is wasteful of circuit space, the market predictors do not have to worry as much that they guessed wrongly. The mass producer of chip 220 does not have to worry that he will accumulate a warehouse full of unsaleable chips.

It is seen from the above that, despite the waste of chip real estate, a decision is purposefully made to cram into the single die 220 more non-redundant and programmably selectable non-core functionality 204 than could possibly be used, or probably will be used, by the chip at one time. (The same could apply to a chip set rather than to a single die.) It is determined that the costs incurred in having this surplus of nonredundant functionality 204 are more than offset by a number of advantages and offsetting factors. First among these offsetting factors is the advantage of quick time to market when market demand changes suddenly. If a standards-setting body (or customers) changes its mind and picks a different interoperability protocol for use in the target market after the IC chip 220 has been mass-produced, the manufacturer still has a possibility of selling his chips into that market if he had the foresight to include ASIC support for the different interoperability protocols, including possible subtypes. Everything is a gamble. If one manufacturer includes only the I/O standard #1 processing block represented by 241 and no other in the front-end of his competing mini-chip, that hypothetical manufacturer takes the gamble that the standard setting body will not switch to alternate standard #2 (block 242). Another manufacturer who operates according to the present invention and provides a mega-ASIC 220 having surplus non-redundant functionality 204 incurs greater up-front costs due to wasted semiconductor real estate. But that latter manufacturer takes less of a gamble from the market-prediction point of view because the one, mass-produced mega-ASIC 220 can now be used in any market which uses at least one of the four I/O front-end standards #1A-#4A′″ handled by blocks 241-244 and any of the four back-end standards #1B-#4B′″ represented by blocks 261-264. Note that the chances of predicting wrongly increase geometrically as the number of interoperability buses and/or protocols increases. Although FIG. 1 shows just a front-end and a back-end for purposes of interoperability with other devices (107, 108), in the modern world, devices are often pressed upon to be interoperable with a large number of other devices, not just a front-end device (107) and a back-end device (108). The present invention helps to reduce the risk of making a fatal marketing prediction regarding what other device or devices, customers will insist on having interoperability with. A second advantage is that it will prolong the sellable-product life. In other words, if customers later decide, unexpectedly, that they will buy product 102 only if it provides interoperability with I/O standard #4A′″ (244) at the front-end and simultaneously with I/O standard #1B (261) at the back-end, the mass producer of the space-wasting, mega-ASIC 220 can easily meet that challenge because his palette of choices allows for such an unexpected combination or mix of interoperabilities. By contrast, the more conventional, space-frugal ASIC will only provide one choice on the menu. If the customer orders fish, he must eat it with tartar source, he cannot order an unexpected mix of fish with seafood sauce. The options-frugal menu does not allow for that. Block 241 must be accompanied by block 261. No one foresaw that customers would want block 244 (seafood sauce) in combination with block 261 (fish). The mass producer of the mega-ASIC 220 may find himself in the enviable position of being the only one in the market space who is able to meet the sudden rush of demand by customers.

By mass producing the space-wasting, mega-ASIC 220, the second manufacturer substantially increases his chances of being able to quickly meet the quickly fluctuating demands of fickle consumer markets, even if they begin to demand an unexpected combination of interoperability capabilities. The cost of not being able to enter a newly emerging market rapidly can be greater than the losses incurred in providing surplus non-redundant functionality 204 in the mega-ASIC 220. The cost of being late-to-market in addition to lost of sales also includes the lost chance of establishing goodwill in the new market and establishing business relationships with vendors and consumers who operate in that market space. The late-to-market manufacturer loses the opportunity to receive valuable feedback from vendors/customers in the new market space and to begin to quickly design the next generation of chips and functionalities for that new market space. The late-to-market manufacturer therefore quickly falls behind the competition. By contrast, the mass production manufacturer who uses the excess functionality design of a mega-ASIC chip like 220 can more often succeed in being first-to-market because his already-mass produced chips 220 will have a greater likelihood of already sporting in their surplus areas 204, the necessary functionalities for serving the emerging market demand. The early-to-market manufacturer will capture all the opportunities that the late-to-market manufacturer missed-out on. Thus, the apparently resource wasteful design of the surplus-packed region 204 is not such a waste after all. Moreover, in fast changing markets, by the time the late-to-market manufacturer brings his redesigned product to market, the market may have already changed yet again thereby rendering his "new" design obsolete before it even has a chance to show itself in the market. One or more misses like this, and soon the late-to-market manufacturer is out of capital and dead in the waters. By contrast, the mega-ASIC manufacturer who appeared to have wasted his capital on the excess functionalities that do not get used, is very much alive in the game, and may in fact, be the market leader.

Another advantage of designing-in a surplus-packed region like 204 has to do with trend developing in transistor and packaging technologies. Transistor sizes (e.g., channel lengths) continue to shrink according to Moore's Law. The number of transistors that can be squeezed into a given circuit space 220 is expected to continue to grow exponentially at least for a few more generations. Thermal problems can be solved by not activating all of the surplus functionality crammed into a mega-ASIC 220. See again, the selective, power cut-off switches represented at 251-254 and 271-274. Mutually-exclusive blocks or blocks least likely to be used simultaneously should be laid-out adjacent to one another so as to reduce heat density. Technologies for making interconnections between the interior of the chip and the exterior are not scaling down as rapidly as transistor sizes are. Therefore, there is a more finite limit on the number of exterior terminals 210 that may be provided on an integrated circuit packaging unit 205 (the exterior terminals 210 may be of the BGA or of other types as appropriate) than there is on the amount of functionality that can be crammed into the circuit space of an IC. There is more of a limit on the number of so-called bonding pads 221-228 that may be operatively provided in the integrated circuit 220. There is more of a limit on the speed at which bonding wires (so-called extra connect wires 207) may be ultrasonically or otherwise bonded to the bonding pads and to the packaging frame. There is more of a limit on the amount of heat that the chip circuitry can safely generate at one time so that it may be properly dissipated by the surrounding packaging 205.

Moreover, there is more of a psychological limit on the number of extra "features" that end-users can learn to cope with in a given product. It has been observed in the industry that end-users often suffer from Technology Exhaustion Syndrome (TES). This occurs when their cell phones (for example) offer so many features that they can never learn all of them in a lifetime. It is just too much and too overwhelming. Customers feel cheated because they feel they have paid for more functionality than they can ever use. Common sense tells them that a product with fewer features could have been manufactured at lower cost and the savings could have been passed on to them, the customers. From a marketing point of view, sometimes it is better to offer a fewer number of user-accessible features to the customers and to not let them know that the chip contains a far greater number of features than what was programmably activated, say by way of FLASH memory 230. From a marketing point of view, it is better to offer unique demographic groups of end-users with a limited, but selective mix of user-accessible features where that mix is optimized to the current demands of the product users in the given market space. By way of example, consider two possible demographic groups: teenaged students and senior citizens. The senior citizen is unlikely to desire a scientific graphing calculator capability for his/her day-to-day life style. The teenaged student is unlikely to desire an automated, doctor's appointments scheduling reminder for his/her day-to-day life style. Each needs a mixture of features tailored to his or her lifestyle.

In view of the above, it may be understood that the present invention provides a one-chip solution (or one chip set solution) for a host of different market spaces (regional markets and/or demographic markets). The present invention is not limited to providing surplus non-redundant and programmably-selectable function options only for input/output standard protocol blocks such as 241-244, 261-264. It also applies to the provision of surplus user-accessible features circuitry 280. The blocks-actuating/de actuating memory 230 may be programmed to activate one portion of the selectable user-accessible functionalities in area 280 while others remain deactivated. More specifically, assume that the illustrated integrated circuit 200 is to be used in a personal digital assistant platform (PDA) or in a third (3G) or later generation cell phone. Consider a first demographic consumer population composed of teenagers who like to play online interactive games in an untethered, wireless environment. To meet the demands of that first demographic group, it might be highly desirable for the user accessible features 280 to include circuitry for managing real-time gaming and wireless communications (e.g., WiFi, Blue-Tooth, etc.) among select pools of game players. On the other hand, consider a second demographic population, which includes health-impaired elderly citizens. Assume that the later group is not interested in playing wireless on-line games but is instead interested in alerting and receiving immediate emergency medical care in case of health problems and in managing appointments to see health care providers and to arrange transportation back and forth. The second group of people may wish to have included in their PDA's the capability of allowing alerting emergency personnel to locate their geographic position very quickly so that police can easily come to their aid in an undesirable neighborhood, or health care providers may find them and administer aid as necessary. Accordingly, it may be desirable in the elderly-serving version of mega-ASIC 220 for the surplus, user-accessible features area 280 to include global positioning satellite technology (GPS) or the like for identifying the geographical location of the electronics unit 200 and it may be desirable for the mega-ASIC 220 to have further circuitry for interactively communicating wirelessly with health care providing networks via secure links. This would be a different kind of interoperability requirement than that needed for the teenage-gaming market space. A third group of people may wish to have RFID capability built into their separate or combination PDA/cellphone allowing them to identity themselves for purposes of driving (obtain driver license), traveling (passport/visa), purchasing (credit card), and/or banking activities. A fourth group may wish to have a camera function in their PDA/cellphone. The business people in a company may wish to find a common available time for scheduling a meeting via wireless data interchange. A group of sales people may wish to have on-line contact with their assistants for arranging their daily appointment schedules in their cellphone with PDA function. Certain doctors (and/or other executives) may wish to able to quickly dictate the patient visit or other information for later transcribing. Many common people may wish to have an integrated garage door opener, and/or universal remote controller (for DVD, VCR, TV, and Hi-Fi stereo) provided in their PDA/cellphone instead of having to find separate pieces of small and portable electronic equipment scattered around the house. A mega-ASIC 220 can be constructed to provide these options with one or more of them being programmably activated while the others remain deactivated depending on which market space the mega-ASIC 220 is being sold into.

The list of surplus, user-accessible and programmably selectable features 280 that may be provided within a single integrated circuit 220 can be quite large, particularly as transistor geometries shrink. The mass producer of the mega-ASIC 220 is not as bound to correctly guessing what specific features or finite mix of features will be most desired in a given market space at a given time as the mass producer would have been, had the surplus amount of user-accessible features 280 not been included in the chip 220. For example, if the mass producer predicts a 90% probability that feature #1 will be a best seller and only a 30% probability that feature #2 will be a best seller, but the prediction turns out to be wrong; the marketplace votes for feature #2 instead, there is no major loss because the mass producer of the mega-ASIC 220 had the foresight to include both of feature #1 and #2 in the mega-ASIC 220. There is less pressure on the marketing department to accurately predict which specific feature or mix of features will be the best seller in a future market space. The list of user-accessible selectable features 280 may include: position locating and navigation assisting circuitry (e.g., GPS based), acoustics processing circuitry (e.g., providing hearing assistance or speech recognition for voice entry of commands or sending messages for finding entries in a dictionary or language translator), circuitry for monitoring health conditions in real-time (e.g., heartbeat, blood pressure, etc.), circuitry for monitoring financial markets in real-time (e.g., stock market prices), circuitry for monitoring email accounts in real-time, circuitry for managing real-time on-line gaming activities, circuitry for monitoring availability of on-line music (MP3) and for storage of selected music, circuitry for managing an on-board camera, circuitry for managing computer peripherals such as wirelessly interconnected printers, servers, and other intelligent peripherals; circuitry for managing dictation operations of an attached or remote tape recorder or tapeless recorder; circuitry for managing pre-scheduled and calendared events (e.g., doctor appointments); circuitry for remotely managing television programming (e.g., recording and time delayed watching of entertainment events); circuitry for remote controlling of home appliances such as lights, ovens, refrigerator, coffee maker, heating and air-conditioning, circuitry for remote controlling of garage door or home security systems including simple door locks, and circuitry for home security monitoring of vacation homes for example or next room babysitting services or circuitry for managing studies by science students or other types of students in various areas of academic endeavors, this including circuitry for operating as a graphing scientific calculator, financial calculator and as an automated studies management coordinator; circuitry for finding a common available time for schedule meetings, circuitry for remotely monitoring rooms (baby sitting) and houses (vacation homes), in addition to receiving and sendng simple messages, emails, weather forecasts and financial data. TABLE 1 provides a nonexhaustive list of the kinds of excess, ASIC function blocks that may be included in a mega-ASIC in accordance with the invention:

TABLE 1

| Wire-coupled I/O | Wireless types of I/O | Real-time signal processing | Work Group Coordination | Attached Peripherals |
|---|---|---|---|---|
| Analog to Digital conversion | RF transmitted protocols (WiFi, BlueTooth, CDMA . . . ) | DSP (Digital Signal Processing) acoustic, video, | Meeting Scheduling | extra memory (FLASH protocols, disk protocols) |
| Digital to Analog conversion | Photonic protocols | GPS (Global Positioning from Satellites) | Workflow coordination (i.e. transcribe dictations) | Extension bus support (USB, FireWire, ATA, SCSI) |
| Ethernet | Acoustic protocols (voice commands) | Security checking | Health care interactions | |
| TC/IP | | | Social interactions | One stop collection of used remote controllers (garage, TV, home security, etc.) |
| High Definition video | | | Interaction monitoring (e.g. babysitting services) | |
| High fidelity, multi channel audio | | | | |
| Tactile feedback (gaming attachments) | | | | |
| Remote Control | Remote Control | | | Remote Control |

It is to be understood that one or more of these surplus user-accessible and programmably-selectable features 280 may be implemented in part as individual ROM sections which may be powered on or disabled as appropriate and which may contain code for execution by a core microcomputer 256/257. The excessively populated, user-accessible feature circuits 280 may also include analog and/or digital interface circuitry (ADC's or DAC's) for interfacing through the limited number of bonding pads 221-228 of the IC 220 with the exterior terminals 210 and exterior circuits. Just as switches 231-234 determine which of I/O blocks 241-244 will have exclusive access to pads 221-224; and just as switches 251-254 determine which of I/O blocks 241-244 will receive power and which will not, similar, programmably actuatable switches may be provided for selectively controlling the coupling of and/or the powering of the various ASIC blocks provided in excess within section 280. For purposes of avoiding thermal hot spots, the various ASIC blocks should be laid-out such that the probability of immediately adjacent ones all being powered on at the same time is small. Thus the problem of excess heat generation in hot spots can be better managed.

Although the selectable ASIC blocks are described here as not being of the defect-compensating, redundancy type, that does not mean there presence does not help in dealing with random spot defects such as 209. Suppose a random spot defect 209 lands on top of I/O block 243, rendering it inoperable. That does not prevent use of mega-ASIC 220 with one of the other, still operative I/O blocks 241, 242 and 244. Thus, even though the surplus ASIC blocks are not provided as redundant, defect bypassing circuitry, they nonetheless may serve in a similar capacity by allowing the mega-ASIC 220 to operate in at another useful mode if not exactly the one that is in most demand in the marketplace at the moment.

Referring to FIG. 3, a process 300 by which a mega-ASIC may be manufactured in accordance with the invention is described. In step 310, a marketing department of a given manufacturer starts to sketch out a wish list 305 of possible features for a new round of products. Perhaps a central core of the new round of products will include a new-generation microprocessor (i.e. 256 of FIG. 2) of particular speed and capabilities conjoined with appropriately sized random access memory (RAM, i.e. 257) and with a ROM containing a core operating system (OS) as well as core software application functionalities. For peripheries around the core microprocessor, the marketing department may begin to list a number of input, output and intermediate interoperability features (e.g., wireless communications, user GUI's) which should be supported by the product in a given set of market spaces. The marketing department may make a list such as shown at 305 which ranks various target market spaces of the new round according to likelihoods of success and, for each of these ranked market spaces, a mix of plural features which would probably make the product more saleable in the given market space, where the plural features are ranked according to order of importance in making the end product more saleable into the given market space.

More specifically, the exemplary wish list 305 shows a first market space identified as MARKET A (with rank #1) for which the marketing department has decided that the product should use a first standard, called Protocol 1.0 to handle front-end communications and a second standard, called Protocol 2.0 to handle back-end communications. However, the marketing department foresees the possibility that an alternate and mutually exclusive Protocol 3.8 might be adopted by early-users for the front-end and a different back-end Protocol, 6.9 might be concurrently used for the back-end. Further, the marketing department determines there is an outside chance that the front end protocol should be one called 4.2 while the back-end protocol should be 7.5. Probability values are assigned to each of these predicted market developments according to foreseen likelihoods of outcome. Additionally, the marketing department decides that, for the A market space (say it is young adolescents), the products should have a full color, high resolution display, with interactive gaming capabilities, including a precision touch-sensitive screen and perhaps a built-in camera.

For the same core technology (250), the marketing group foresees yet another market space, market B (rank #3, say senior citizens) which could also be serviced. This other market space has its respective list of mutually-exclusive front-end and back-end interoperability protocols. Moreover, this separate market space has a number of add-on features, which the marketing department feels might be important for its demographically targeted users group. For example, for elderly consumers with possibly impaired eyesight, it may be more important to have a responsiveness to voice commands and a magnified, easy to read screen rather than a touch-sensitive display with full color capabilities. Moreover, features such as global positioning detection may be required for emergency health alert functionality. It may be desirable to have a voice and/or music synthesizer included as part of the peripheral functionalities. An elderly citizen who is not able to speak well may use the voice synthesizer to make a telephone call to an emergency health care provider. The latter feature may or may not be useful in the teenager-biased market space defined as MARKET A. Then again, for another market demographic group of travelers to foreign countries, it may be very useful to a have a combination of a built in language translator and voice synthesizer so the traveler may ask a local resident in a foreign country to point out directions to a desired location. Each end-user group may have a different set of ASIC functionalities that best serve his or her needs.

At step 320, the company engineering department receives the wish list 305 created by the marketing department. The wish list 305 may be much longer than that shown and may have hundreds or thousands of features and/or requirements listed on it. Some of them may not even be technologically possible or practical. Personnel in the marketing department may not be fully knowledgeable in what is possible under a current state of technology. The job of the engineering department will be to figure out how many of the peripheral functionalities on the wish list can be practically crammed into a single chip while meeting certain costs and technology constraints. The rankings of markets and desired features for each market space on list 305 help the engineering department to better understand which features are critical to marketing plans. The contents of the wish list 305 and help the engineering department to decide where to draw the line between essential features, desired features and optional features and whether to leave out some of the less valuable add-on features.

As the work of various engineering groups draws to a close, the excess (204) of designs is crammed into a tape-out disk 325 together with the essential core design (250). Accordingly, the finalized tape-out disk 325 will contain layout information and other details for making the final set of core functionalities (250) and of the non-redundant, non-core functionalities (204). Surplus non-core functionalities (204) my come form a variety of specialty disciplines. Engineering groups who work on these may include those that specialize in wireless communications, in network interoperability issues, in analog-to-digital conversion problems, and so forth. The final design crams into the single mega-chip (or alternatively into a multi-chip mega-chip set) more non-redundant, non-core functionality than probably will or can be used by the chip (or chip set) at one time in a given market space and/or while being packaged by a given packaging that has limited number of exterior package terminals. The amount of excess non-core functionality and the specific choices of which surplus functionality should be included is determined in response to the wish list 305 created by the marketing department in step 310. Thus, both marketing and engineering have inputs in determining what surplus functionalities are crammed into the mega-ASIC chip. The resultant design work is a combination of marketing predictions about multiple possibilities in targeted market spaces and engineering know-how about how to implement the corresponding functionalities via ASIC circuitry.

At step 330 the resulting tape-out data file(s) 325 are sent to one or more lithography houses where corresponding lithography masks are made. It is to be noted that a single set of lithography masks is produced for servicing two or more of the market spaces defined in list 305 by the marketing department, where the functionality subsets of the two or more market spaces include non-overlapping functionalities, in other words, those whose circuit space will be substantially wasted when servicing at least one of the targeted market spaces.

After the lithography mask sets are manufactured, debugged, and finalized, they are sent to a foundry house for an initial first silicon run. The first silicon run determines whether all the functionalities in the initial tape-out 325 are operational as was expected by engineering. Bugs are found-out and corrected. In one embodiment, if errors are found in surplus functionalities, a decision may be made to forego fixing those design flaws until a later product generation so products can be produced for the rest of the markets as this may be still better than having no products for any markets. Bugs that are found in higher priority functionalities should, of course be found and fixed. A second round of re-design (320) and tape-out (325) may be required to produce so-called second silicon (beta silicon) before a mass-producible design is finally approved for mass production efforts 340.

Given that one, mega-ASIC 220 has now been designed to service a large number of different market spaces, a larger volume of chips will probably be needed to meet the expected demands of those diversified market spaces. The designer of the mega-ASIC 220 will therefore be asking the mass production foundry to produce a comparatively larger volume of such mega-ASIC chips as opposed to the smaller production volumes that would have been requested for several mini-chips that each mini-chip services only a smaller, single market space. Economies of scale apply. As a result, the designer of the mega-ASIC 220 will be able to establish a volume customer relationship with the chosen fabrication foundry (or foundries). The establishment of volume customer relationship(s) is indicated in side bar 343. Such preferable vendor/customer relationship(s) allows the chip designer to obtain preferential treatment from the foundry, including lower price, earlier time slots on the production line and more help from engineers in tweaking the fabrication process for better yield. Volume learning curves apply. At step 340, mass production of the base dice commences. An accumulated inventory of wafers 345 containing the desired mega—ASIC's 220 is generated.

After the mass production run, or even during the time that the mass production inventory 345 is being accumulated that may be a year or more from the initial marketing making the wish list, the sales department of the company can begin to gather reports from the field about what types of product are being currently demanded in various market spaces. These real-time reports may be accumulated, analyzed, and ranked to determine which features, or a specific mix of features, that happen to be on the mass produced mega-ASIC's 345 are probably most saleable in the current market place and at what volume given current market conditions. This research activity is represented by block 350 of the flow charted process 300. A mega-ASIC programming file 355 is generated in response to the sales research results of activity 350. The produced mega-ASIC programming file 355 contains programming information (manufactured instructing signals) which instructs automated programming equipment (not shown) at the company's warehouse(s) how to program the still-blank mega-ASIC's held in inventory 345 and how many of each type of programmed dice (or programmed, packaged devices) to produce for servicing current demand in the analyzed, current market spaces. The manufactured instructing signals may designate which excess blocks are to be activated and/or which are to be deactivated.

At step 360, the instruction files 355 are applied to the automated programming equipment (not shown) for FLASH-programming or otherwise programming the blank mega-ASIC's either before or after the corresponding wafers are cut and/or the dice are packaged so that the desired features and/or mix of specific surplus features (204) may be made operative in appropriate numbers of the pre-produced base dice.

In one embodiment, all mega-ASIC's are all preprogrammed at the time of manufacturing to serve the largest market (default state), and then only a relatively smaller portion is reprogrammed (for example by the wireless, serial-number basis disclosed above) to serve smaller markets to thereby reduce overall programming time.

Because of the real-time responsiveness provided in steps 350-360 to current market conditions, at step 370, the owner of the just-in-time, programmed mega-ASIC's is able to enter the targeted market spaces very quickly and with an appropriate quantity of product (not too much and not too little). The shortened time between receiving the reports from the sales department at step 350 and the responsive programming of the blank mega-ASICS at step 360 allows for this. An advantageous by-product of the fast time-to-market represented by step 370 is that the mass producer of the programmed mega-ASIC chips 345/355 will be able to satisfy rush orders of vendors (e.g., board-level manufacturers) who are try to meet the demands of sporadically emerging markets. The mass producer of the programmed mega-ASIC chips 345/355 will be able to opportunistically enter emerging market regions as situations evolve. The mass producer of the programmed mega-ASIC chips 345/355 will be able to opportunistically establish good business relationships with intermediate customers (board-level vendors) and/or end-users of his mega-ASIC chips. The mass producer will be able to opportunistically establish goodwill and to receive helpful feedback from the quickly-serviced customers.

As a result of the relationships established in step 370, at step 380, the marketing department of the mass producer of the programmed mega-ASIC chips 345/355 will be able to opportunistically collect feedback reports from the customer companies that have designed the programmed mega-ASIC into their end products and/or from the end use customers that use those products in the various market spaces. This quickly-acquired feedback 380 may give the marketing department new insights as to what additional features or feature mixes will next be desired by the various customer bases in next-generation products. The next-generation products may be ones that have faster and more advanced core microprocessors (256) as well as a larger numbers of faster, more desirable, surplus non-core functionalities to choose amongst thanks to the use of transistors of smaller size.

In step 390 the marketing department uses the feedback obtained from step 380 to predict and rank the new features that probably will be desired by various markets (re-ranked market spaces) for the next-generation core design. Path 394 represents the creation of a new wish list 395 similar to, but richer than, the original list 305 and directed to the next-generation core design. Step 396 returns the process to 320 where engineering receives the new wish list 395 and begins to design a new mega-ASIC chip that will cram into its circuit space more non-redundant and non-core functionality than will probably be used, where that new functionality is aimed at the new markets defined by the new wish list 395.

It may be seen from the overall flow of FIG. 3 that the use of a mega-ASIC chip 220 establishes customer relationships, creates new opportunities and faster response times for real-time changes in various market spaces (regional markets and/or user groups). The time-to-market and time-to-start of the next-generation products is faster than what could be provided had the mass producer instead used a chip (mini-chip 161) that had only the bare essentials designed into it for meeting the needs of a specific one market space (e.g., 181 of FIG. 1). The more bulky, mega-ASIC chip 220 actually makes its mass producer more nimble and more able to quickly enter new and emerging markets as opportunities appear. It allows its mass producer to establish stronger business relationships (step 370) with existing or potential customers and to get more and quicker feedback (step 380). It allows its mass producer to establish relationships with fabrication foundries as a volume customer rather than as a specialty-run customer (a customer that requires only a small volume of produced wafers). It allows its mass producer to hedge their bets so that they are not stuck with an inventory 345 of dice that have a wrong front-end protocol block or a wrong back-end protocol block or a lack of certain unique features which suddenly are in demand within the fickle market place.

FIG. 4 is illustrative of one of the approaches that may be used to switch frontend and/or backend circuits into or out of operative interconnection within a given mega-ASIC 400. Tri-state logic may be used place the outputs of various circuit blocks in a high impedance mode rather than active mode as desired. FIG. 4 shows by way of example, a number of logic layout tiles and two I/O output tiles (a large size and large power I/O tile and a smaller sized and lesser power I/O tile). The configuration memory may be programmed to enable the use of the outputs of the various logic tiles and/or I/O output tiles as desired. (The tristate outputs may be subject to further time multiplexing controls, which are not shown for purpose of simplicity.) By way of example, if market research shows a strong demand for chips having both GPS capability (Global Positioning Satellites) and BlueTooth capability but not Wi-Fi capability, then the configuration memory may be programmed to enable the first two while deactivating the latter (including minimizing the power draw of the logic in the latter). If market research shows a strong demand for chips having Fire-Wire output capability but not SCSI or ATA output capability, then the configuration memory may be programmed to enable the first while deactivating the latter two (including minimizing the power draw of the logic in the latter two). Additionally, the amount of current sinking and/or current sourcing capabilities provided by the combination of the large and small I/O tiles may be programmably defined by the configuration memory. A minimum amount of drive current may be established at the output pad by enabling only the small I/O tile. An intermediate amount of drive current may be established at the output pad by enabling only the large I/O tile. A maximum amount of drive current may be established at the same output pad by enabling both of the large and small I/O tiles such that their current sourcing and/or sinking capacities are added together.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A mega-ASIC comprising:
   (a) an integrated circuit substrate having a predefined circuit space and a predefined number of bonding pads;
   (b) an excess of ASIC functional blocks provided in said predefined circuit space, said excess including more ASIC functional blocks than can be operatively used at one time by the ASIC, the excess of ASIC functional blocks being defined to not count redundant defect-bypassing circuits, which if provided, are provided for recovering from spot manufacturing defects, where the excess ASIC functional blocks include different I/O blocks and/or different user-feature blocks,
   wherein the excess and different I/O blocks include a first set of front-end I/O blocks and a second set of, back-end I/O blocks, and where the mega-ASIC further includes:
   programmable, block activating/de-activating means capable of selectively activating one or more of the front-end I/O blocks and of selectively activating one or more of the back-end I/O blocks.

2. A mega-ASIC comprising:
   (a) an integrated circuit substrate having a predefined circuit space and a predefined number of bonding pads;
   (b) an excess of ASIC functional blocks provided in said predefined circuit space, said excess including more ASIC functional blocks than can be operatively used at one time by the ASIC, the excess of ASIC functional blocks being defined to not count redundant defect-bypassing circuits, which if provided, are provided for recovering from spot manufacturing defect, where the excess ASIC functional blocks include different I/O blocks and/or different user-feature blocks; and
   (c) programmable, block activating/de-activating means capable of selectively activating a subset of one or more of said excess of ASIC functional blocks; wherein:
      (c.1) said programmable, block activating/de-activating means is operatively coupled to a buried bonding pad for receiving program data from the buried bonding pad.

3. A mega-ASIC comprising:
   (a) an integrated circuit substrate having a predefined circuit space and a predefined number of bonding pads;

(b) an excess of ASIC functional blocks provided in said predefined circuit space, said excess including more ASIC functional blocks than can be operatively used at one time by the ASIC, the excess of ASIC functional blocks being defined to not count redundant defect-bypassing circuits, which if provided, are provided for recovering from spot manufacturing defects, where the excess ASIC functional blocks include different I/O blocks and/or different user-feature blocks; and (c) programmable, block activating/de-activating means capable of selectively activating a subset of one or more of said excess of ASIC functional blocks;

wherein:

(c.1) said programmable, block activating/de-activating means is operatively coupled to a serial testing circuit for receiving program data from the serial testing circuit, and (c.1a) said serial testing circuit includes decryption circuitry for receiving an encrypted key signal, where proper decryption of the encrypted key signal is required to enable the programmable, block activating/de-activating means to be programmed with configuration data.

\* \* \* \* \*